United States Patent [19]

Eguchi et al.

[11] Patent Number: 5,614,354
[45] Date of Patent: Mar. 25, 1997

US005614354A

[54] METHOD OF FORMING POSITIVE POLYIMIDE PATTERNS

[75] Inventors: Masuichi Eguchi, Kyoto; Masaya Asano; Kazutaka Kusano, both of Shiga, all of Japan

[73] Assignee: Toray Industries, Inc., Japan

[21] Appl. No.: 692,337

[22] PCT Filed: Jan. 26, 1994

[86] PCT No.: PCT/JP94/00104

§ 371 Date: Nov. 22, 1994

§ 102(e) Date: Nov. 22, 1994

[87] PCT Pub. No.: WO94/18607

PCT Pub. Date: Aug. 18, 1994

Related U.S. Application Data

[63] Continuation of Ser. No. 313,267, Nov. 22, 1994.

[30] Foreign Application Priority Data

| Feb. 3, 1993 | [JP] | Japan | 5-016302 |
| Mar. 23, 1993 | [JP] | Japan | 5-063894 |
| Apr. 16, 1993 | [JP] | Japan | 5-090130 |

[51] Int. Cl.$^6$ .............................. G03F 7/012; G03F 7/037
[52] U.S. Cl. ................ 430/326; 430/167; 430/197; 430/281.1; 430/283.1; 430/330; 430/906
[58] Field of Search ............................ 430/326, 330, 430/906, 197, 281, 283, 167

[56] References Cited

U.S. PATENT DOCUMENTS

| 4,451,551 | 5/1984 | Kataoka et al. | 430/283 |
| 4,565,767 | 1/1986 | Kataoka et al. | 430/283 |
| 4,587,197 | 5/1986 | Kojima et al. | 430/197 |
| 4,608,333 | 8/1986 | Ohbayashi et al. | 430/906 |
| 4,701,300 | 10/1987 | Merrem et al. | 430/197 |
| 4,830,953 | 5/1989 | Bateman | 430/330 |
| 5,114,826 | 5/1992 | Kwong et al. | 430/197 |
| 5,238,784 | 8/1993 | Tokoh et al. | 430/906 |
| 5,320,935 | 6/1994 | Maeda et al. | 430/330 |
| 5,348,835 | 9/1994 | Oba et al. | 430/330 |

OTHER PUBLICATIONS

Spak M.A., High temperature Post–Exposure Bake for AZ 4000 Photoresist SPIE vol. 539 Advances in Resist Technology and Processing (1985) p. 299.

*Primary Examiner*—John S. Chu
*Attorney, Agent, or Firm*—Austin R. Miller

[57] ABSTRACT

The present invention relates to a method of forming positive polyimide patterns which includes a process wherein a film of a composition of actinic radiation-sensitive polyimide precursor is formed on a substrate which is selectively exposed to an actinic radiation, then such a treatment is applied to the film that the film in unexposed portion attains higher degree of curing than the film in exposed portion after the exposure, and the film is removed from the exposed portion. According to the invention, such an unexpected effect can be achieved as a positive polyimide pattern can be formed by using a composition of actinic radiation-sensitive polyimide precursor which has only been used in forming negative patterns. According to the invention, the positive polyimide pattern can be formed easily and the pattern obtained has excellent performance.

13 Claims, No Drawings

METHOD OF FORMING POSITIVE POLYIMIDE PATTERNS

This application is a continuation of application Ser. No. 08/313,267, filed Nov. 22, 1994.

TECHNICAL FIELD

The present invention relates to a method of forming a positive polyimide pattern by exposure to actinic radiation of a radiation-sensitive polyimide precursor, and particularly relates to a method of forming a positive polyimide pattern by exposure of an actinic radiation-sensitive polyimide precursor.

BACKGROUND TECHNIQUES

The following methods have been known as methods of forming polyimide patterns which use a composition of actinic radiation-sensitive polyimide precursors.
(A) A polyimide pattern forming process which uses a composition wherein carbon-carbon double bond which can be dimerized or polymerized by exposure to actinic radiation and wherein an amino group or a quaternary salt thereof are added to polyamic acid (disclosed, for example, in U.S. Pat. No. 4,243,743).
(B) A polyimide pattern forming process which uses a composition of polyamic acid with acrylamide added thereto (disclosed in, for example, EP Laid-open No. 430220).
(C) A polyimide pattern forming process which uses a composition of actinic radiation-sensitive polyimide precursors wherein a photosensitive group is introduced to polyamic acid with ester group.

However, all of these processes are of negative type wherein the film in portions exposed to the radiation remains, because the irradiated pattern is developed in such a state that the film in the exposed portion has photo-cured to a greater degree than that of the unexposed portion. In negative type processes, dust on the mask used in exposure leads to a defect produced therein resulting in pin holes formed in the polyimide film. For this reason, there have been problems such as low yield of production and low reliability particularly where the polyimide coating is used as a protective layer for semiconductor elements or as an inter-layer insulation layer for multi-layer wiring in high-density packaging. Thus there has been a demand for a method of forming positive polyimide patterns by means of a composition of actinic radiation-sensitive polyimide precursors.

The following processes have been disclosed as methods of forming positive polyimide patterns by means of an actinic radiation-sensitive composition of polyimide precursors.
(D) Polyimide pattern forming processes which uses a composition of actinic radiation-sensitive polyimide precursors obtained by introducing a photo-degradable photosensitivity to polyamic acid with ester group (disclosed in, for example, Japanese Patent Laid-Open No.1-61747).
(E) Positive polyimide pattern forming processes wherein a naphthoquinonediazide compound of a particular molecular structure is added to polyamic acid having a particular structure and heat treatment within a particular temperature range is applied after exposure (disclosed, for example, in Polymer Preprints, Japan, vol.40, No.3, 821, (1991))

However, the processes described above have not been put into practice due to problems such as complicated process of preparing the composition of actinic radiation-sensitive polyimide precursors and lack of photosensitivity.

Accordingly, an object of the invention is to provide a process of forming an excellent positive polyimide pattern by using a composition of actinic radiation-sensitive polyimide precursors which can be easily manufactured.

Another object of the invention is to provide a process of forming a positive polyimide pattern having excellent photoreactivity (photosensitivity, etc.).

Further another object of the invention is to prevent the yield of production and reliability from decreasing when the polyimide film is used as the protective layer for semiconductor elements or inter-layer insulation layer for multilayer wiring of high-density packaging substrate.

DESCRIPTION OF THE INVENTION

According to the invention, such an unexpected effect can be achieved by forming positive polyimide patterns through a composition of actinic radiation-sensitive polyimide precursors which has only been used in forming negative patterns.

Use of the composition of actinic radiation-sensitive polyimide precursors which has only been used in forming negative patterns is practical because it can be more easily manufactured than the compositions which have been known as the materials to form positive patterns.

Also the positive polyimide pattern formed according to the invention has excellent photo-reactivity (photosensitivity, etc.).

Because positive polyimide patterns having good performance can be formed easily as described above, this process does not suffer from decrease in the yield of production and decrease in the reliability which have been taking place when the polyimide film is used as the protective layer for semiconductor elements or the inter-layer insulation layer for multi-layer wiring of high-density packaging substrate.

DETAILED DESCRIPTION OF THE INVENTION

The objects of the invention may be achieved by a method of forming positive polyimide patterns wherein a film of a composition of actinic radiation-sensitive polyimide precursors is formed on a substrate which is then selectively exposed to actinic radiation, subjected to a process which makes the degree of curing of the film in a portion not exposed to the radiation greater than that of an exposed portion, and the film in the exposed portion is removed.

The inventors of this application studied ways to achieve the above objects, and found that the positive polyimide pattern could be formed through such a process, which has been unknown in the prior art, as the film is removed from the exposed portion by making use of the difference in the degree of curing between the portion not exposed to the radiation and the exposed portion, thereby accomplishing the invention.

The following substances may be used as the composition of actinic radiation-sensitive polyimide precursors, although the invention is not limited to the use of these substances:
(1) Compositions of polyamic acid with compounds having photo-reactive group and amino group added thereto (for example, those disclosed in U.S. Pat. No.4,243,743, U.S. Pat. No. 4,451,551);
(2) Compositions of polyamic acid with acrylamides added thereto (for example, those disclosed in EP Patent Publication No.430220);

(3) Compositions of actinic radiation-sensitive polyimide precursors wherein a photosensitive group is introduced into polyamic acid by means of ester group; and
(4) Compositions of polyamic acid with compounds having amino group and azide group and/or bisazide compound added thereto (for example, those disclosed in U.S. Pat. No. 4,451,551 and EP Patent Publication No.65352).

Preferred compositions of actinic radiation-sensitive polyimide precursors of the invention contain the following components:
(a) a polymer (A) having the structural unit represented by the general formula
(1) as the main constituent,

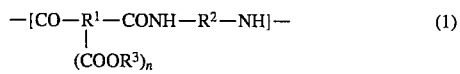

$$-[CO-R^1-CONH-R^2-NH]- \quad (1)$$
$$\quad\quad\;\;|$$
$$\quad\quad(COOR^3)_n$$

(wherein R1 represents a trivalent or tetravalent organic group having at least two carbon atoms. R2 represents a divalent organic group having at least two carbon atoms. R3 represents an alkaline metallic ion, ammonium ion, hydrogen or an organic group having 1 to 30 carbon atoms. Suffix n represents an integer 1 or 2.)
(b) a compound (B) having amino group and/or amide group The polymer (A) having the structural unit represented by the general formula (1) as the main constituent according to the invention is one which is converted by heating or in the presence of an appropriate catalyst to a polymer having an imide ring or other cyclic structure (referred to as polyimide-based polymer hereafter).

R1 in the general formula (1) represents a trivalent or tetravalent organic group having at least two carbon atoms. For the reason of heat resistance, it is preferable that R1 be a trivalent or tetravalent organic group which includes aromatic ring or heterocyclic aromatic ring and has 6 to 30 carbon atoms. Specifically, phenyl group, biphenyl group, terphenyl group, naphthalene group, perylene group, diphenyl ether group, diphenyl sulfone group, diphenyl propane group, benzophenone group and biphenyltrifluoropropane group are the candidates, although R1 is not limited to these groups.

R2 in the general formula (1) represents a divalent organic group having at least two carbon atoms, while it is preferably a divalent organic group which includes aromatic ring or heterocyclic aromatic ring and has 6 to 30 carbon atoms for the reason of heat resistance. Specifically, phenyl group, biphenyl group, terphenyl group, naphthalene group, perylene group, diphenyl ether group, diphenyl sulfone group, diphenyl propane group, benzophenone group and biphenyltrifluoropropane group are the candidates, although R2 is not limited to these groups.

Further, aliphatic groups having siloxane structure may be copolymerized to such an extent that the heat resistance is not significantly deteriorated, to obtain R1 and R2 for improved adhesion to the substrate. Specifically, bis(propyl)-tetramethyl-disiloxane group or the like may be copolymerized to a degree of 1 to 10 mol %.

R3 represents an alkaline metal ion, ammonium ion, hydrogen or an organic group having one to thirty carbon atoms. While hydrogen, methyl group, ethyl group, isopropyl group, butyl group, methyl methacrylate group, ethyl acrylate group and O-nitrobenzyl group are preferred for R3, R3 is not limited to these groups. Hydrogen is particularly preferred for R3.

The polymer (A) may be either constituted from one kind from of each of R1, R2 and R3, or a copolymer constituted from two or more kinds of each of R1, R2 and R3.

The polymer (A) may also be constituted from only the structural units represented by the general formula (1), or may be a copolymer or a blend with other structural units. It is preferable that the polymer (A) has contents of the structural unit represented by the general formula (1) of 90 mol % or over. Kinds and quantities of the structural units used in the copolymer or the blend should preferably be within such a range that does not deteriorate the heat resistance of the polymer obtained in the final heating process.

The polymer (A) may specifically be a polyamic acid synthesized from the following monomers and esters derived therefrom, although not limited to these substances:
pyromellitic acid dianhydride and 4,4'-diaminodiphenyl ether,
3,3', 4,4'-benzophenone-tetracarbolic acid dianhydride and 4,4'-diaminodiphenyl ether,
3,3', 4,4'-biphenyl-tetracarboxylic acid dianhydride and 4,4'-diaminodiphenyl ether,
3,3', 4,4'-biphenyl-trifluoropropane tetracarboxylic acid dianhydride and 4,4'-diaminodiphenyl ether,
3,3', 4,4'-biphenyl-sulfontetracarborylic acid dianhydride and 4,4'-diaminodiphenyl ether,
pyromellitic acid dianhydride and 3,3'(or 4,4')-diaminodiphenyl sulfone,
3,3', 4,4'-benzophenone-tetracarboxylic acid dianhydride and 3,3'(or 4,4')-diaminodiphenylsulfone,
3,3', 4,4'-biphenyltetracarboxylic acid dianhydride and 3,3'(or 4,4')-diaminodiphenylsulfone,
pyromellitic acid dianhydride and 4,4'-diaminodiphenylsulfide,
3,3', 4,4'-benzophenone-tetracarboxylic acid dianhydride and 4,4'-diaminodiphenylsulfide,
3,3', 4,4'-biphenyl-tetracarboxylic acid dianhydride and 4,4'-diaminodiphenylsulfide,
3,3', 4,4'-benzophenone-tetracarboxylic acid dianhydride and p-phenylenediamide,
3,3', 4,4'-biphenyltetracarboxylic acid dianhydride and p-phenylenediamine,
3,3', 4,4'-diphenylether-tetracarboxylic acid dianhydride and p-phenylenediamine,
3,3', 4,4'-biphenyltrifluoropropane-tetracarboxylic acid dianhydride and p-phenylenediamine,
3,3', 4,4'-biphenyltetracarboxylic acid dianhydride and terphenyldiamine,
3,3', 4,4'-biphenyl-tetracarboxylic acid dianhydride, 3,3', 4,4'-benzophenone-tetracarboxylic acid dianhydride and p-phenylenediamine,
pyromellitic acid dianhydrate, 3,3', 4,4'-benzophenone-tetracarboxylic acid dianhydride and 3,3'-(or 4,4') diaminodiphenyl ether,
pyromellitic acid dianhydrate, 3,3', 4,4'-biphenyl-tetracarboxylic acid dianhydride and p-phenylenediamine,
3,3', 4,4'-benzophenone-tetracarboxylic acid dianhydride, 4,4'-diaminodiphenyl ether and bis-(3-aminopropyl) tetramethyldisiloxane,
pyromellitic acid dianhydride, 4,4'-diaminodiphenyl ether and bis-(3-aminopropyl) tetramethyldisiloxane, and
3,3', 4,4'-biphenyl-tetracarboxylic acid dianhydride, 4,4'-diaminodiphenyl ether and bis-(3-aminopropyl) tetramethyldisiloxane.

These polyamic acids and esters derived therefrom can be synthesized in known processes. That is, polyamic acid, for example, can be synthesized by selectively combining tetracarboxylic acid dianhydride and diamine, and making them react in a polar solvent comprising N-methyl-2-pyrrolidone, N,N-dimethylacetamide or N,N-dimethylformamide as the main constituent, or in γ-butyrolactone. Esters of polyamic acid can be synthesized in processes, for example, proposed in Japanese Patent Laid-Open (Kokai) No.61-72022 and Japanese Patent Publication (Koho) No.55-30207).

Compound (B) having amino group and/or amide group will be described below.

For the amino group, primary to quaternary animo group or rings such as pyridine rings having basicity may be used. The amide group may include urea group and/or urethane group. The compound (B) preferably has such amino group or amide group and also has organic group having carbon atoms. More preferably, the compound (B) is a compound comprising organic groups having 2 to 30 carbon atoms, while one having amino group or amide group bonded to aliphatic group is particularly preferable.

Among compounds having amino group or amide group, one that has photoreactive group is preferable.

Photoreactive group in the invention refers to ethylenic unsaturated double bond, aromatic azide group, aromatic sulfonylazide group, or the like. Preferred examples of the compound having photoreactive group and amino group or amide group are;

compounds having ethylenic unsaturated double bond such as acrylamide, methacrylamide, N-methylacrylamide, N,N-dimethylacrylamide, N,N-dimethylmethacrylamide, N,N-diethylacrylamide, N,N-diethylmethacrylamide, N-methylmethacrylamide, N-isopropylmethacrylamide, N-isopropylacrylamide, N-butylmethacrylamide, N-butylacrylamide, diacetonacrylamide, diacetonmethacrylamide, N-cyclohexylmethacrylamide, N-cyclohexylacrylamide, acryloylmorpholine, methacryloylmorpholine, acryloylpiperidine, methacryloylpiperidine, crotonamide, N-methylcrotonamide, N-ethylcrotonamide, N-butylcrotonamide, allylamide acetate, allylamide propionate, allylamine, diallylamine, triallylamine, metharylamine, vinylpyridine, dimethylaminoethyl acrylate, diethylaminoethyl acrylate, dimethylaminoethyl methacrylate, diethylaminoethyl methacrylate, dimethylaminopropyl methacrylate, N,N-dimethylaminoethylmethacrylamide, N,N-dimethylaminopropylmethacrylamide, N,N-diethylaminoethylmethacrylamide, N,N-diethylaminopropylmethacrylamide, N,N-dimethylaminoethylacrylamide, N,N-dimethylaminopropylacrYlamide, N,N-diethylaminoethylacrylamide, N,N-diethylaminopropylacrylamide, ethyltrimethylammonium methacrylate, 2-hydroxylpropyltrimethylammonium methacrylate, ethyl-N-(2-methacryloyloxyethyl) urethane, 1-propyl-3-(2-methacryloyloxyethyl) urea;

compounds having aromatic azide group such as p- (or m-) azidodimethylaminoethylbenzoic acid, p- (or m-) azidodiethylaminoethylbenzoic acid, p- (or m-) azidodimethylaminopropylbenzoic acid, and p-(or m-) azidodiethylaminopropylbenzoic acid; or compounds having aromatic sulfonylazide group such as p-(or m-sulfonylazidedimethylaminoethylbenzoic acid, p-(or m-) sulfonylazidediethylaminoethylbenzoic acid, p- (or m-) sulfonylazidedimethylaminopropylbenzoic acid, and p- (or m-) sulfonylazidediethylaminopropylbenzoic acid.

Among the above-mentioned compounds, those having amino group or amide group and a photoreactive group which includes ethylenic unsaturated double bond are particularly preferable. Further, compounds wherein the ethylenic unsaturated double bond is acryl group or methacryl group are more preferable.

Examples of compound having amino group or amide group without photoreactive group are as follows, but not restricted to these; trimethylamine, propylamine, cyclohexylamine, dimethylaminoethyl acetate, diethylaminoethyl acetate, dimethylaminoethanol, dimethylaminoethyl propionate, acetamide, N-methylacetamide, N-ethylacetamide, N-methylformamide, N-ethylformamide, N,N-dimethylacetamide and N,N-dimethylformamide. Compounds having amide group include those which act as solvent to dissolve the polyimide precursor, such as N-dimethylacetamide and N,N-dimethylformamide.

The above-mentioned compounds having amino group or amide group are used individually or in a mixture of two or more of them.

It is desirable that the compounds which have amino group or amide group and act as solvent to dissolve the polyimide precursor such as N-dimethylacetamide and N,N-dimethylformamide are mixed in an equivalent weight of 5%, preferably 30% or more, of all carboxyl groups contained in the polymer, with the polymer concentration being 1.0 weight percent or over. Proportions out of this range lead to lower sensitivity and/or thicker coating of the film during application, thereby resulting many restrictions on the application.

It is desirable that the compounds which have amino group or amide group and do not dissolve the polyimide precursor by themselves are mixed in an equivalent weight of 5%, preferably 30%, or more of all component units of the polymer, and mixed in a proportion of within five times the equivalent weight of all carboxyl groups contained in the polymer. Proportions out of this range lead lower sensitivity and/or many restrictions on the application.

The composition of actinic radiation-sensitive polyimide precursors preferably includes an photo-initiator, a sensitizer and a photoreactive monomer.

The following compounds are preferred for the photo-initiator, although the photo-initiator is not restricted to these compounds;

aromatic amine compounds such as Michler's ketone, 4,4'-diethylaminobenzophenone, N-phenyldiethanolamine and N-phenylglycin;

cyclic oxime ester compounds exemplified by 1-phenylpropanedione-2-(O-ethoxycarbonyl)oxime, 1-phenyl-1,2-buthanedione-2-(O-methoxycarbonyl)oxime, 1-phenylpropanedione-2-(O-benzoyl)oxime and 1-2-diphenylethanedione-1-(O-benzoyl)oxim; and cyclic compounds exemplified by 3-phenyl-5-isoxazolone. Oxime ester compounds are particularly preferable for the reason of sensitivity. These photo-initiators are used individually or in a mixture of two or more of them.

The photo-initiator is mixed in a proportion of 1 to 100 weight percent, preferably 1 to 50 weight percent, in proportion to the polymer components. Proportions out of this range lead to lower sensitivity and/or many restrictions on the application.

As the sensitizer, Michler's ketone, 4,4'-diethylaminobenzophenone, 3,3'-carbonylbis(diethylaminocoumarine), Eastman Kodak Co.'s Coumarine 339, Coumarine 338, Coumarine 314 and Coumarine 7 are effective, although it is not limited to these substances. These sensitizers are used individually or in a mixture of two or more of them.

The sensitizer is mixed in a proportion of 0.1 to 20 weight percent, preferably 0.2 to 10 weight percent, of the polymer components.

A combination of oxime ester compound as the photo-initiator and coumarine compound as the sensitizer is particularly effective.

As the photo-reactive monomer, 2-hydroxyethylmethacrylate, methacrylic acid, trimethylolpropanetriacrylate, trimethylolpropanetrimethacrylate, and ethylene glycol dimethacrylate may be used. These photo-reactive monomers are used individually or in a mixture of two or more of them. Use of these photoreactive monomers being added in 1 to 20 weight percent to the polymer components can further improve the sensitivity.

The composition of actinic radiation-sensitive polyimide precursors can be obtained by mixing the polymer (A), compound (B) and, as required, the photo-initiator, the sensitizer and the photo-reactive monomer in a solvent.

The solvent used in the above process may be aprotic polar solvent such as N-methyl-2-pyrrolidone, N,N-dimethylacetamide, N,N-dimethylformamide, dimethylsulfoxide, hexamethylphosphorotriamide, γ-butylolactone and N,N-dimethylacrylamide, being used individually or in a mixture of two or more of them, although the solvent is not limited to these.

Also a surface-active agent to improve the wettability of the substrate to the composition of polyimide precursors, inorganic particles such as $SiO_2$ and $TiO_2$, or polyimide particles may be added as required.

Now a method of forming the positive polyimide pattern by using the composition of actinic radiation-sensitive polyimide precursors will be described below.

The composition of actinic radiation-sensitive polyimide precursors is applied onto a substrate. Substrates made by forming silicon, aluminum, aluminum nitride, alumina ceramics, glass ceramics, sapphire or semiconductor may be used, although it is not limited to these. The composition may be applied by rotary coating process using a spinner, by means of a spray coater, dipping or roll coating, although the method of application is not limited to these processes. While thickness of the coat varies depending on the coating means, concentration of solids in the composition, viscosity and other factors, application is usually carried out so that the dried film thickness becomes 0.1 to 150 μm.

Then the substrate coated with the composition of polyimide precursors is dried to obtain a film of the composition of polyimide precursors. The drying process is preferably carried out at a temperature from 50° to 100° C. for a duration from one minute to several hours.

Then a mask carrying a desired pattern is placed on the film, to irradiate the film with an actinic radiation through the mask, for exposure. The actinic radiation used in the exposure may be ultraviolet light, visible light, electron beam or X-ray, while ultraviolet light and visible light are preferable.

In the invention, it is important to process the film in such a manner that the film in unexposed portion has higher degree of curing than the film in exposed portion after the exposure. In order to make the film in the unexposed portion obtain higher degree of curing than the film in the exposed portion, heat treatment, irradiation with infrared light and iradiation with microwave are effective, while heat treatment is particularly preferable for the simplicity of the process. Heat treatment is carried out preferably for a duration from one minute to several hours at the same or higher temperature as that in the drying process. Specifically, the temperature is in a range from 60° to 180° C., and more preferably from 90° to 170° C. By applying such treatment after exposure, the film in the unexposed portion becomes harder and therefore more resistant to the developer solution than the film in the exposed portion. Consequently, the film in the exposed portion is removed faster than the film in the unexposed portion thereby forming a positive image.

Curing referred to herein is a process wherein components other than polyimide, such as compounds having amino group or amide group, the photo-initiator, the photo-reactive monomer, solvent and water generated by imidization, are made to evaporate from the film of the composition of polyimide precursors. Thickness of the film of the composition of polyimide precursors decreases as the curing proceeds, eventually reaching a certain thickness when the curing completes, namely when it becomes a polyimide film. Difference in the degree of curing between the unexposed portion and the exposed portion after the curing process is indicated in terms of the ratio of thicknesses (namely ratio of curing=thickness of unexposed film/thickness of exposed film). While the ratio of curing varies depending on the conditions of curing acceleration process, it should preferably be within 0.98 and more preferably be within 0.97. Although a negative image is formed momentarily at an early stage of development when curing acceleration process is not applied (ratio of curing 1.000), it soon disappears.

After the treatment, the image is developed and the film in the exposed portion is removed. The removal can be carried out by peeling, dissolution or etching. Specifically, the film in the exposed portion is mechanically peeled off, removed by plasma etching or dissolved into a developing solution, while the process using a developing solution is preferable for the reason of simplicity. As the developing solution, an alkaline aqueous solution including 0.5 to 30 weight percent of aminoalcohol and an alkali other than aminoalcohol, or an aqueous solution of organic ammonium hydroxide is preferable.

The aminoalcohol may be monoethanolamine, diethanolamine, triethanolamine, isopropanolamine, dimethylaminoethanol, tri-isopropanolamine, 2-hydroxymethylaminoethanol, N-isobutyldiethanolamine, 2-aminocyclohexanol or 2-aminomethylcyclohexanol, although not limited to these. Among these, monoethanolamine, diethanolamine and isopropanolamine are preferable.

Concentration of the aminoalcohol in the developing solution is preferably from 0.5 to 30 weight percent, or more preferably, from 1.5 to 20 weight percent. When the concentration is below 0.5 weight percent, time taken in development varies greatly depending on the type of the positive photo-sensitive polyimide precursor, drying conditions and the conditions of exposure, making the process unstable. Especially when thickness of the photo-sensitive polyimide precursor film increases, the process of development is retarded and the period of time of development becomes significantly longer. When the concentration exceeds 30 weight percent, on the other hand, development proceeds too quickly, making the period of development difficult to control.

The alkali other than aminoalcohol may be an aqueous solution of organic ammoniumhydroxide such as aqueous solution of tetramethylammoniumhydroxide, aqueous solution of tetraethylammoniumhydroxide or aqueous solution of choline, aqueous solution of sodium hydroxide, aqueous solution of potassium hydroxide, aqueous solution of barium hydroxide, aqueous solution of lithium hydroxide, aqueous solution of sodium carbonate, aqueous solution of potassium carbonate, aqueous solution of barium carbonate or aqueous solution of lithium carbonate. Preferred alkalis are aqueous solution of organic ammoniumhydroxide such as aqueous solution of tetramethylammoniumhydroxide, aqueous solution of tetraethylammoniumhydroxide and aqueous solution of choline. These alkalis are used either individually, or two or more thereof are used in a mixture.

Concentration of the alkali other than aminoalcohol in the developing solution is preferably from 0.5 to 15 weight percent, or more preferably, from 1.5 to 10 weight percent. When the concentration is below 0.5 weight percent, development of the photo-sensitive polyimide precursor hardly proceeds. When the concentration exceeds 15 weight percent, on the other hand, development proceeds too quickly, making the development period difficult to control and, moreover, even the unexposed portion to be retained may be dissolved making it difficult to form a good positive pattern.

The aqueous solution of organic ammoniumhydroxide can be used as the developing solution even when it is not mixed with an aminoalcohol. The aqueous solution of organic ammoniumhydroxide is commonly used in the field of positive photoresist. For example, aqueous solution of tetramethylammoniumhydroxide, aqueous solution of tetraethylammoniumhydroxide and aqueous solution of choline are used. Concentration of the aqueous solution is preferably from 0.05 to 15 weight percent. Specifically, NMD-3 (2.38% aqueous solution of tetramethylammoniumhydroxide) produced by Tokyo Ouka Kogyo Co., Ltd. may be used.

The developing solution according to the invention may include additive components to the extent that does not affect the effects of the invention.

It is preferable to rinse the developed pattern with water or an alcohol such as methanol, ethanol and isopropyl alcohol.

The film is further cured to convert the polyimide precursor to polyimide in order to obtain a polyimide insulation film. Curing process after the development is carried out by increasing the temperature in steps up to a predetermined temperature, or by increasing the temperature continuously in a predetermined range, for a period from 5 minutes to 5 hours. The maximum temperature of curing should be from 250° to 500° C., and preferably from 300° to 450° C. For example, heat treatment is applied at 130° C., 200° C. and 400° C., for 30 minutes at each temperature. Or otherwise, The temperature may be increased linearly from the room temperature to 400° C. over a period of two hours.

The invention will be described below through illustrative examples although the invention is not limited to these examples.

EXAMPLE 1

80.55 grams of 3,3', 4,4'-benzophenone-tetracarboxylic acid dianhydride and 54.53 grams of pyromellitic acid dianhydride were made to react with 2.3 grams of ethanol in 549 grams of N-methyl-2-pyrrolidone at 70° C. for 3 hours. Then it was cooled down to 20° C., 95.10 grams of 4,4'-diaminodiphenylether and bis(3-aminopropyl)tetramethyldisiloxane were added to react at 60° C. for 3 hours, thereby to obtain the polymer (A) solution having viscosity of 122 poise (at 25C). 85.11 grams (equivalent to total carboxyl groups in the polymer) of methacrylamide, 23.6 grams of 3-phenyl-5-isoxazolon, 2.36 grams of 3,3'-carbonylbis(diethylaminocoumarin) and 315 grams of γ-butylolactone were added to the solution, to obtain a composition of actinic radiation-sensitive polyimide precursor.

A 4-inch silicon wafer was coated with the composition of polyimide precursor and dried at 60° C. In nitrogen atmosphere for 30 minutes, thereby to obtain a film of thickness 5.28 μm. Then the film was exposed to ultraviolet radiation of intensity 1000 mJ/cm2 (wavelength 365 nm) through a photo mask made of chromium by using an ultraviolet irradiation machine PLA-501F made by Canon Inc. After exposure, heat treatment was applied at a temperature 140° C. for 3 minutes on a hot plate, thereby to obtain positive film of photosensitive polyimide precursor. This process resulted in the unexposed film 4.13 μm thick and the exposed film 4.42 μm thick, with the ratio of curing 0.934. As the wafer was immersed in a developing solution comprising a 2.38% aqueous solution of tetramethylammonium hydroxide, the film on the exposed portion dissolved to leave the film on the unexposed portion 2.34 μm thick whereon the image was formed. The wafer was then rinsed with water and dried by blowing nitrogen gas. The positive pattern thus obtained was cured in nitrogen gas atmosphere at 130° C., 200° C. and 400° C., for 30 minutes at each temperature, and a positive polyimide pattern was formed.

Comparative example 1

A wafer obtained in the first example before the post-exposure heat treatment (hardness ratio 1,000) was immersed in a developing solution comprising a 2.38% aqueous solution of tetramethylammonium hydroxide, and the unexposed portion dissolved to leave the exposed portion to form a negative image momentarily. However, as the development process proceeded, both the unexposed portion and exposed portion dissolved and positive pattern was not formed.

EXAMPLE 2

23.6 grams of 1-phenylpropanedione-2-(O-ethoxycarbonyl)oxime, 2.36 grams of Eastman Kodak's Coumarine 339, 315 grams of γ-butylolactone and acrylamide were added to the polymer solution obtained in the first example in equivalent weight (71.08 grams) to the total carboxyl groups in the polymer, thereby to prepare a composition of actinic radiation-sensitive polyimide precursor.

A 4-inch silicon wafer was coated with the composition of polyimide precursors and dried at 80° C. on a hot plate for 3 minutes, thereby to obtain a film of the polyimide precursor having a thickness 5.43 μm. Then the film was exposed to ultraviolet radiation of intensity 1000mJ/cm2 (wavelength 365 nm) through a photo mask made of chromium by using an ultraviolet irradiation machine PLA-501F made by Canon Inc. After exposure, heat treatment was applied temperature 140° C. for 3 minutes on a hot plate, thereby to obtain a positive film of the photo-sensitive polyimide precursor. This process resulted in the unexposed film 4.30 μm thick and the exposed film 4.64 μm thick, with the ratio of curing 0.927. Then the wafer was immersed in a developing solution comprising a 2.38% aqueous solution of tetramethylammonium hydroxide, and rinsed with water and dried by blowing nitrogen gas, resulting in a positive polyimide pattern being formed.

EXAMPLE 3

23.6 grams of 3-phenyl-5-isoxazolon, 2.36 grams of 3,3'-carbonylbis(diethylaminocoumarin), 315 grams of γ-butylolactone and diacetonacrylamide were added to the polymer solution obtained in the first example in equivalent weight (169.22 grams) to the total carboxyl groups in the polymer, thereby to prepare a composition of an actinic radiation-sensitive polyimide precursor.

A 4-inch silicon wafer was coated with the composition of polyimide precursors and dried at 80° C. on a hot plate for 3 minutes, thereby to obtain a film of the polyimide precursor having a thickness 6.83 μm. Then the film was exposed to ultraviolet radiation of intensity 1000mJ/cm2 (wavelength 365 nm) through a photo mask made of chromium by using an ultraviolet irradiation machine PLA-501F made by Canon Inc. After exposure, heat treatment was applied at a temperature 140° C. for 3 minutes on a hot plate, thereby to obtain positive film of photosensitive polyimide precursor. This process resulted in the unexposed film 4.54 μm thick and the exposed film 5.51 μm thick, with the ratio of curing 0.823. Then the wafer was immersed in a developing solution comprising a 2.38% aqueous solution of tetramethylammonium hydroxide, and rinsed with water and dried by blowing nitrogen gas, resulting in a positive polyimide pattern being formed.

EXAMPLE 4

23.6 grams of 3-phenyl-5-isoxazolon, 2.50 grams of 3,3'-carbonylbis(diethylaminocoumarin), 315 grams of γ-butylolactone and N-methylmethacrylamide were added to the polymer solution (A) obtained in the first example in equivalent weight (85.11 grams) to the total carboxyl groups in the polymer, thereby to prepare a composition of actinic radiation-sensitive polyimide precursor.

A 4-inch silicon wafer was coated with the composition of polyimide precursors and dried at 80° C. on a hot plate for 3 minutes, thereby to obtain a film of polyimide precursor having a thickness 4.55 μm. Then the film was exposed to ultraviolet radiation of intensity 1000mJ/cm2 (wavelength 365nm) through a photo mask made of chromium by using an ultraviolet irradiation machine PLA-501F made by Canon Inc. After exposure, heat treatment was applied at a temperature 140° C. for 3 minutes on a hot plate, thereby to obtain a positive film of photo-sensitive polyimide precursor. This process resulted in the unexposed film 3.61 μm thick and the exposed film 4.44 μm thick, with the ratio of curing 0.813. Then the wafer was immersed in a developing solution comprising a 2.38% aqueous solution of tetramethylammonium hydroxide, and rinsed with water and dried by blowing nitrogen gas, resulting in a positive polyimide pattern being formed.

EXAMPLE 5

A composition of actinic radiation-sensitive polyimide precursor was prepared by adding 141.17 grams of acryloylmorpholine instead of methacrylamide in the process of the first example.

A 4-inch silicon wafer was coated with the composition off polyimide precursors and dried at 80° C. on a hot plate for 3 minutes, thereby to obtain a film of polyimide precursor having a thickness 4.54 μm. Then the film was exposed to ultraviolet radiation of intensity 1000mJ/cm2 (wavelength 365 nm) through a photo mask made of chromium by using an ultraviolet irradiation machine PLA-501F made by Canon Inc. After exposure, heat treatment was applied at a temperature 140° C. for 3 minutes on a hot plate, thereby to obtain positive film of photosensitive polyimide precursor. This process resulted in the unexposed film 3.55 μm thick and the exposed film 4.02 μm thick, with the ratio of curing 0.883. Then the wafer was immersed in a developing solution comprising a 2.38% aqueous solution of tetramethylammonium hydroxide, rinsed with water and dried by blowing nitrogen gas, resulting in a positive polyimide pattern being formed.

EXAMPLE 6

A composition of actinic radiation-sensitive polyimide precursor was prepared by adding 113.16 grams of N-isopropylacrylamide instead of methacrylamide in the process of the first example.

A 4-inch silicon wafer was coated with the composition of polyimide precursors and dried at 80° C. on a hot plate for 3 minutes, thereby to obtain a film of polyimide precursor having a thickness 5.18 μm. Then the film was exposed to ultraviolet radiation of intensity 1000mJ/cm2 (wavelength 365 nm) through a photo mask made of chromium by using an ultraviolet irradiation machine PLA-501F made by Canon Inc. After exposure, heat treatment was applied at a temperature 140° C. for 3 minutes on a hot plate, thereby to obtain a positive film of photo-sensitive polyimide precursor. This process resulted in the unexposed film 4.12 μm thick and the exposed film 4.44 μm thick, with the ratio of curing 0.928. Then the wafer was immersed in a developing solution comprising 1000 grams of N-methyl-2-pyrrolidone, 700 grams of xylene and 100 grams of water, then rinsed with water and dried by blowing nitrogen gas, resulting in a positive polyimide pattern being formed.

EXAMPLE 7

A composition of an actinic radiation-sensitive polyimide precursor was prepared by adding 59.07 grams of acetamide and 260.0 grams of 2-hydroxyethylmethacrylate instead of methacrylamide in the process of the first example.

A 4-inch silicon wafer was coated with the composition of polyimide precursor and dried at 80° C. on a hot plate for 3 minutes, thereby to obtain a film of the polyimide precursor having a thickness 5.44 μm. Then the film was exposed to ultraviolet radiation of intensity 1000mJ/cm2 (wavelength 365 nm) through a photo mask made of chromium by using an ultraviolet irradiation machine PLA-501F made by Canon Inc. After exposure, heat treatment was applied at a temperature 140° C. for 3 minutes on a hot plate, thereby to obtain positive film of the photo-sensitive polyimide precursor. This process resulted in the unexposed film 3.96 μm thick and the exposed film 4.38 μm thick, with the ratio of curing 0.905. Then the wafer was immersed in a developing solution comprising a 2.38% aqueous solution of tetramethylammonium hydroxide, rinsed with water and dried by blowing nitrogen gas, resulting in a positive polyimide pattern being formed.

EXAMPLE 8

80.55 grams of 3,3', 4,4'-benzophenone-tetracarboxylic acid dianhydride and 54.53 grams of pyromellitic acid dianhydride were made to react with 2.3 grams of ethanol and 549 grams of N-methyl-2-pyrrolidone at 70° C. for 3 hours. Then it was cooled down to 20° C., 95.10 grams of 4,4'-diaminodiphenylether and 6.20 grams of bis(3-aminopropyl) tetramethyldisiloxane were added to react at 60° C. for 3 hours, thereby to obtain the polymer (A) solution having viscosity of 122 poise (at 25C). 157.3 grams (equivalent to the total carboxyl groups in the polymer) of dimethylaminoethyl methacrylate, 47.27 grams of 3-phenyl-5-isoxasolon, 2.36 grams of 3,3'-carbonylbis (diethylaminocoumarin) and 190 grams of N-methyl-2-pyrrolidone were added to the solution, to obtain a composition of actinic radiation-sensitive polyimide precursors.

A 4-inch silicon wafer was coated with the composition of the photosensitive polyimide precursors and dried at 60° C. In nitrogen atmosphere for 30 minutes, thereby to obtain a film of the photo-sensitive polyimide precursors having thickness 4.72 μm. Then the film was exposed to ultraviolet radiation of intensity 600 mJ/cm2 (wavelength 365 nm) through a photo mask made of chromium by using an ultraviolet irradiation machine PLA-501F made by Canon Inc. After exposure, heat treatment was applied at a temperature 140° C. for 3 minutes on a hot plate. This process resulted in the unexposed film 3.64 μm thick and the exposed film 4.08 μm thick, with the ratio of curing 0.892.

As the wafer was immersed in a developer comprising a 2.38% aqueous solution tetramethylammonium hydroxide, the exposed portion dissolved to leave the image in the unexposed portion. The wafer was then rinsed with water and dried by blowing nitrogen gas. The positive pattern thus obtained was cured in nitrogen gas atmosphere at 130° C., 200° C. and 400° C., for 30 minutes at each temperature, and a positive polyimide pattern was formed.

Comparative example 2

A wafer obtained in the eighth example before the post-exposure heat treatment was immersed in a developing solution comprising a 2.38% aqueous solution of tetramethylammonium hydroxide, and the unexposed portion dissolved to leave the exposed portion and forming a negative image momentarily. However, as the development process proceeded, both the unexposed portion and exposed portion dissolved and positive pattern was not formed.

EXAMPLES 9 through 11, example for comparison 3

80.55 grams of 3,3', 4,4'-benzophenone-tetracarboxylic acid dianhydride and 54.53 grams of pyromellitic acid dianhydride were made to react with 2.3 grams of ethanol and 549 grams of N-methyl-2-pyrrolidone at 70° C. for 3 hours. Then it was cooled down to 20° C., followed by the addition of 95.10 grams of 4,4'-diaminodiphenylether and 6.20 grams of bis(3-aminopropyl)tetramethyldisiloxane, to react at 60° C. for 3 hours, thereby to obtain the polymer (A) solution having viscosity of 122 poise (at 25C). 47.27 grams of 3-phenyl-5-isoxazolon, 2.36 grams of 3,3'-carbonylbis-(diethylaminocoumarin), 190 grams of N-methyl-2-pyrrolidone and dimethylaminoethyl methacrylate (DMM) were added to the solution, in equivalent weights of 0 (example of comparison 3), 0.25 (ninth example), 0.50 (tenth example) and 2.00 (eleventh example) to the total carboxyl groups in the polymer, respectively, to obtain compositions of actinic radiation-sensitive polyimide precursors, 4-inch silicon wafers were coated with these compositions of the polyimide precursors and dried at 60° C. In nitrogen atmosphere for 30 minutes, thereby to obtain films of photo-sensitive polyimide precursors having thickness around 5.00 μm. Then the films were exposed to ultraviolet radiation through a photo mask made of chromium by using an ultraviolet irradiation machine PLA-501F made by Canon Inc., while changing the radiation intensity. After exposure, heat treatment was applied at a temperature 140° C. for 3 minutes on a hot plate. The wafers were immersed in a developing solution comprising a 2.38% aqueous solution of tetramethylammonium hydroxide, then rinsed with water and dried by blowing nitrogen gas. Ratio of hardening after the heat treatment and the result of development are shown in Table 1.

TABLE 1

| | Ratio of curing (Note) | Result of development |
|---|---|---|
| Comparative example 3 | 1.00 | No image obtained with 2000 mJ/cm2 |
| Example 9 | 0.97 | Positive image obtained with 2000 mJ/cm2 |
| Example 10 | 0.92 | Positive image obtained with 1000 mJ/cm2 |
| Example 11 | 0.87 | Positive image obtained with 200 mJ/cm2 |

Note: Values on 2000 mJ/cm2 basis.

EXAMPLE 12

47.27 grams of 3-phenyl-5-isoxazolon, 2.36 grams of 3,3'-carbonylbis(diethylaminocoumarin), 190 grams of N-methyl-2-pyrrolidone and dimethylaminoethyl acetic acid were added to the polymer solution (A) obtained in the eighth example in equivalent weight to the total carboxyl groups in the polymer and trimethylolpropanetrimethacrylate was added in proportion of 15% to the polymer, thereby to prepare a composition of actinic radiation-sensitive polyimide precursor.

A 4-inch silicon wafer was coated with the composition of the photosensitive polyimide precursors and dried at 80° C. on a hot plate for 3 minutes, thereby to obtain a film of polyimide precursors having thickness 5.00 μm. Then the film was exposed to ultraviolet radiation of intensity 2000mJ/cm2 (wavelength 365 nm) through a photo mask made of chromium by using an ultraviolet irradiation machine PLA-501F made by Canon Inc. After exposure, heat treatment was applied at a temperature 140° C. for 3 minutes on a hot plate. This process resulted in the unexposed film 3.90 μm thick and the exposed film 4.02 μm thick, with the ratio of curing 0.970. Then the wafer was immersed in a developing solution comprising a 2.38% aqueous solution of tetramethylammonium hydroxide, rinsed with water and dried by blowing nitrogen gas, and a positive polyimide pattern was formed.

EXAMPLE 13

161.1 grams of 3,3', 4,4'-benzophenone-tetracarboxylic acid dianhydride was made to react with 2.3 grams of ethanol and 549 grams of N-methyl-2-pyrrolidone at 70° C. for 3 hours. Then it was cooled down to 20° C., 95.10 grams of 4,4'-diaminodiphenylether and 6.20 grams of bis(3-aminopropyl) tetramethyldisiloxane were added to react at 60° C. for 3 hours, thereby to obtain the polymer (A) solution having viscosity of 100 poise (at 25C). 157.3 grams (equivalent to total carboxyl groups in the polymer) of dimethylaminoethyl methacrylate, 52.48 grams of N-phenylglycin, 2.62 grams of 3,3'-carbonylbis(diethylaminocoumarin) and 190 grams of N-methyl-2-pyrrolidone were added to the solution, to obtain a composition of actinic radiation-sensitive polyimide precursors.

A 4-inch silicon wafer was coated with the composition of the polyimide precursors and dried at 80° C. on a hot plate for 3 minutes, thereby to obtain a film of polyimide precursors around 5.00 μm thick. Then the film was exposed to ultraviolet radiation of intensity 2000mJ/cm2 (wavelength 365nm) through a photo mask made of chromium by using an ultraviolet irradiation machine PLA-501F made by Canon Inc. After exposure, heat treatment was applied at a temperature 140° C. for 3 minutes on a hot plate. This process resulted in the unexposed film 3.88 μm thick and the exposed film 4.03 μm thick, with the ratio of curing 0.963. Then the wafer was immersed in a developing solution comprising a 2.38% aqueous solution of tetramethylammonium hydroxide, rinsed with water and dried by blowing nitrogen gas, resulting in a positive image being formed.

EXAMPLE 14

A composition of actinic radiation-reactive polyimide precursor was prepared by adding 5.25 grams of Michler's ketone instead of N-phenylglycin and 3,3'-carbonylbis(diethylaminocoumarin) in the process of the 13th example.

A 4-inch silicon wafer was coated with the composition of polyimide precursors and dried at 80° C. on a hot plate for 3 minutes, thereby to obtain a film of polyimide precursor having a thickness 5.00 μm. Then the film was exposed to ultraviolet radiation of intensity 2000mJ/cm2 (wavelength 365nm) through a photo mask made of chromium by using an ultraviolet irradiation machine PLA-501F made by Canon Inc. After exposure, heat treatment was applied at a temperature 130° C. for 5 minutes on a hot plate. This process resulted in the unexposed film 3.85 μm thick and the exposed film 4.01 μm thick, with the ratio of curing 0.960. Then the wafer was immersed in a developing solution comprising a 2.38% aqueous solution of tetramethylammonium hydroxide, rinsed with water and dried by blowing nitrogen gas, resulting in a positive image being formed.

EXAMPLE 15

47.27 grams of 3-phenyl-5-isoxazolon, 2.36 grams of "Coumarin" 339 produced by Eastman Kodak Co., 190 grams of N-methyl-2-pyrrolidone and dimethylaminopropylmethacrylamide were added to the polymer solution (A) obtained in the eighth example in equivalent weight to the total carboxyl groups in the polymer and 2-hydroxyethylmethacrylate was added in proportion of 10% to the polymer, thereby to prepare a composition of actinic radiation-sensitive polyimide precursor.

A 4-inch silicon wafer was coated with the composition of the photosensitive polyimide precursors and dried at 80° C. on a hot plate for 3 minutes, thereby to obtain a film of the polyimide precursor having thickness of 5.00 μm. Then the film was exposed to ultraviolet radiation of intensity 600mJ/cm2 (wavelength 365nm) through a photo mask made of chromium by using an ultraviolet irradiation machine PLA-501F made by Canon Inc. After exposure, heat treatment was applied at a temperature 130° C. for 7 minutes on a hot plate. This process resulted in the unexposed film 3.64 μm thick and the exposed film 4.10 μm thick, with the ratio of curing 0.888. The wafer was then immersed in a developing solution comprising a 2.38% aqueous solution of tetramethylammonium hydroxide, rinsed with water and dried by blowing nitrogen gas, and a positive image was formed.

EXAMPLE 16

147.1 grams of 3,3', 4,4'-biphenyltetracarboxylic acid dianhydride was made to react with 4.6 grams of ethanol and 599 grams of N-methyl-2-pyrrolidone at 70° C. for 3 hours. Then it was cooled down to 20° C., followed by the addition of 54.05 grams of paraphenylendiamine to react at 60° C. for 3 hours, thereby to obtain the polymer (A) solution having viscosity of 500 poise (at 25C). 185.3 grams (equivalent to the total carboxyl groups in the polymer) of dimethylaminoethyl methacrylate, 30.17 grams of 3-phenyl-5-isoxazolon and 250 grams of N-methyl-2-pyrrolidone were added to the solution, to obtain a composition of actinic radiation-sensitive polyimide precursor.

A 4-inch silicon wafer processed by means of bonding improvement agent AP-400 produced by Toray Industries, Inc. was coated with the composition of the polyimide precursors and dried at 60° C. In a drier for 30 minutes, thereby to form a film 5.00 μm thick. Then the film was exposed to ultraviolet radiation of intensity 1000mJ/cm2 (wavelength 365nm) through a photo mask made of chromium by using an ultraviolet irradiation machine PLA-501F made by Canon Inc. After exposure, heat treatment was applied at a temperature 120° C. for 15 minutes on a hot plate. This process resulted in the unexposed film 3.74 μm thick and the exposed film 4.19 μm thick, with the ratio of curing 0.893. Then the wafer was immersed in a developing solution comprising a 5% aqueous solution of choline, rinsed with water and dried by blowing nitrogen gas, resulting in a positive image being formed.

Reference 1

Synthesis of composition of actinic radiation-sensitive polyimide precursor (A)

The composition of actinic radiation-sensitive polyimide precursor (A) was obtained similarly to the eighth example.

Reference 2

Synthesis of composition of actinic radiation-sensitive polyimide precursor (B)

161.1 grams of 3,3', 4,4'-benzophenone-tetracarboxylic acid dianhydride was made to react with 2.3 grams of ethanol and 549 grams of N-methyl-2-pyrrolidone at 70° C. for 3 hours. Then it was cooled down to 20° C., followed by the addition of 95.1 grams of 4,4'-diaminodiphenylether and 6.2 grams of bis(3-aminopropyl) tetramethyldisiloxane to react at 60° C. for 3 hours, thereby to obtain the polymer solution having viscosity of 100 poise (at 25C). 157.3 grams (equivalent to carboxyl group in the polymer) of dimethylaminoethyl methacrylate, 2.27 grams of 3-phenyl-5-isoxazolon, 2.62 grams of 3,3'-carbonylbis(diethylaminocoumaroline) and 190 grams of N-methyl-2-pyrrolidone were added to the solution, to obtain composition of actinic radiation-sensitive polyimide precursor (B).

Reference 3

Synthesis of composition of an actinic radiation-sensitive polyimide precursor (C)

147.1 grams of 3,3', 4,4'-biphenyltetracarboxylic acid dianhydride was made to react with 4.6 grams of ethanol and 599 grams of N-methyl-2-pyrrolidone at 70° C. for 3 hours. Then it was cooled down to 20° C followed by the addition of 54.05 grams of paraphenylenediamine to react at 60° C. for 3 hours, thereby to obtain the polymer solution having viscosity of 500 poise (at 25C). 185.3 grams (equivalent to the carboxyl groups in the polymer) of dimethylaminoethyl methacrylate, 30.17 grams of 3-phenyl-5-isoxazolon, 2.62 grams of 3,3'-carbonylbis(diethylaminocoumaroline) and 250 grams of N-methyl-2-pyrrolidone were added to the solution, to obtain composition of actinic radiation-sensitive polyimide precursor (C).

EXAMPLE 17

A composition of actinic radiation-sensitive polyimide precursor containing 15 weight percent of monoethanolamine was prepared in an aqueous solution of tetramethylammonium hydroxide having a concentration of 2.5 weight percent.

A 4-inch silicon wafer was spin-coated with the composition of actinic radiation-sensitive polyimide precursors (A) obtained in the process of reference 1 and dried at 60° C. In an oven for 30 minutes, thereby to obtain a film 6.4 μm thick. Then the film was exposed to radiation of intensity 200mJ/cm2 (wavelength 365nm) through a photo mask made of chromium by using a contact aligner PLA-501F made by Canon Inc. After exposure, heat treatment was applied at a temperature 140° C. for 3 minutes on a hot plate. Then the wafer was immersed in the developing solution, rinsed with water and dried by blowing nitrogen gas.

Optical microscope observation of the film after the 3-minute development process indicated complete resolution of a through hole 10 μm in diameter, and uniform resolution over the entire region from the center to the periphery of the wafer. Film thickness after development was 5.6 μm, which represented a good film thickness retaining ratio of 87.5% compared to the thickness before development.

EXAMPLE 18

Pattern forming was carried out under the same conditions as those of the 17th example, except that the aqueous solution including 5 weight percent of choline wherein 15 weight percent of monoethanolamine was contained was used as the developing solution for the actinic radiation-sensitive polyimide precursor.

Optical microscope observation of the film after the 3-minute development process indicated complete resolution of a through hole 10 μm in diameter, and uniform resolution over the entire region from the center to the periphery of the wafer. Film thickness after development was 5.9 μm, which represented a good film thickness retaining ratio of 92% compared to the thickness before development.

EXAMPLE 19

Pattern forming was carried out under the same conditions as those of the 17th example, except that film was formed on composition of the actinic radiation-sensitive polyimide precursor (A) obtained in the process of reference 1 so that the dried film thickness become 12.3 μm.

Optical microscope observation of the film after the 4-minute development process indicated complete resolution of a through hole 20 μm in diameter, and uniform resolution over the entire region from the center to the periphery of the wafer. Film thickness after development was 11.5 μm, which represented a good film thickness retaining ratio of 94% compared to the thickness before development.

EXAMPLE 20

Pattern forming was carried out under the same conditions as those of the 17th example, except that the composition of actinic radiation-sensitive polyimide precursor (B) obtained in the process of reference 2 was used.

Optical microscope observation of the film after the 3-minute development process indicated complete resolution of a through hole 10 μm in diameter, and uniform resolution over the entire region from the center to the periphery of the wafer. Film thickness after development was 5.5 μm, which represented a good film thickness retaining ratio of 86% to the thickness before development.

EXAMPLE 21

Pattern forming was carried out under exactly the same conditions as those of the 17th example, except that the composition of actinic radiation-sensitive polyimide precursor (C) obtained in the process of reference 3 was used.

Optical microscope observation of the film after the 2-minute development process indicated complete resolution of a through hole 10 μm in diameter, and uniform resolution over entire region from the center to the periphery of the wafer. Film thickness after development was 5.5 μn, which represented a good film thickness retaining ratio of 86% to the thickness before development. Industrial Applications of the Invention The positive polyimide insulation film obtained according to the invention has such applications as passivation film for semiconductors, protective film for semiconductor elements, and inter-layer insulation film for multilayered wiring in high-density packaging.

What is claimed is:

1. A method of forming a positive polyimide pattern on a substrate, the steps which comprise:

(a) preparing an actinic radiation-sensitive polyimide precursor composition comprising a polymer (A) and a compound (B), said polymer (A) having the structural unit represented by the general formula (1) as the main constituent,

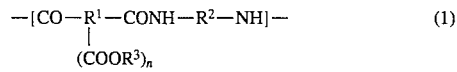

$$-[CO-R^1-CONH-R^2-NH]- \quad (1)$$
$$\phantom{-[CO-R^1}|\phantom{CONH-R^2-NH]-}$$
$$\phantom{-[CO-R^1-CO}(COOR^3)_n$$

wherein $R^1$ is a trivalent or tetravalent organic group having at least two carbon atoms, $R^2$ is a divalent organic group having at least two carbon atoms, $R^3$ is an alkali metal ion, ammonium ion, hydrogen or an organic group having one to thirty carbon atoms, and n is 1 or 2; said compound (B) having at least one functional group selected from the group consisting of an amino group and an amide group, said compound (B) also having at least one photoreactive moiety selected from the group consisting of an ethylenic unsaturated double bond, an aromatic azide group and an aromatic sulfonylazide group; said precursor composition being essentially free of any naphthoquinone diazide compounds;

(b) applying said precursor composition to said substrate to form a film on said substrate;

(c) selectively exposing said film to actinic radiation, with a portion of said film exposed to said actinic radiation and another unexposed portion of said film shielded from said actinic radiation;

(d) applying a heat treatment to said film, thereby causing said unexposed portion of said film to attain a higher degree of curing than said exposed portion; and (e) removing said exposed portion from said film.

2. A method of forming a positive polyimide pattern on a substrate according to claim 1, wherein said heat treatment is at least one treatment selected from the group consisting of a heat treatment, infrared irradiation and microwave irradiation.

3. A method of forming a positive polyimide pattern on a substrate according to claim 1, wherein $R^3$ in said general formula (1) is hydrogen.

4. A method of forming a positive polyimide pattern on a substrate according to claim 1, wherein said actinic radiation-sensitive polyimide precursor composition further comprises a photo-initiator.

5. A method of forming a positive polyimide pattern on a substrate according to claim 1, wherein said actinic radiation-sensitive polyimide precursor composition further comprises a sensitizer.

6. A method of forming a positive polyimide pattern on a substrate according to claim 1, wherein said actinic radiation-sensitive polyimide precursor composition further comprises a photoreactive monomer.

7. A method of forming a positive polyimide pattern on a substrate according to claim 1, wherein said exposed portion is removed by an alkaline aqueous solution.

8. A method of forming a positive polyimide pattern on a substrate according to claim 7, wherein said alkaline aqueous solution comprises about 0.5 to 30 weight percent of aminoalcohol and an alkali other than aminoalcohols.

9. A method of forming a positive polyimide pattern on a substrate according to claim 8, wherein said alkali is an organic ammonium hydroxide.

10. A method of forming a positive polyimide pattern on a substrate according to claim 8, wherein said organic ammonium hydroxide comprises at least one compound selected from the group consisting of tetramethylammonium hydroxide, tetraethylammonium hydroxide and choline.

11. A method of forming a positive polyimide pattern on a substrate according to claim 8, wherein said alkali comprises about 0.5 to 15 weight percent of said alkaline aqueous solution.

12. A method of forming a positive polyimide pattern on a substrate according to claim 7, wherein said alkaline aqueous solution comprises an aqueous solution of an organic ammonium hydroxide.

13. A method of forming a positive polyimide pattern on a substrate according to claim 12, wherein said organic ammonium hydroxide comprises at least one compound selected from the group consisting of tetramethylammonium hydroxide, tetraethylammonium hydroxide and choline.

* * * * *

UNITED STATES PATENT AND TRADEMARK OFFICE
CERTIFICATE OF CORRECTION

PATENT NO. : 5,614,354
DATED : March 25, 1997
INVENTOR(S) : Masuichi Eguchi et al It is certified that error appears in the above-indentified patent and that said Letters Patent is hereby corrected as shown below:

Column 4, line 14, please change "tetracarbolic" to --tetracarboxylic--.

In Column 10, line 11, please change "hardness ratio 1,000" to --hardness ratio 1.000--; and line 36, after "treatment was applied", please insert --at a--.

Column 11, line 41, please change "off" to --of--.

Column 19, line 2, please change "8" to --9--.

Signed and Sealed this

Twenty-fourth Day of June, 1997

Attest:

BRUCE LEHMAN

*Attesting Officer*  *Commissioner of Patents and Trademarks*